(12) United States Patent
Marino et al.

(10) Patent No.: US 8,963,289 B2
(45) Date of Patent: Feb. 24, 2015

(54) DIGITAL SEMICONDUCTOR VARIABLE CAPACITOR

(71) Applicants: Fabio Alessio Marino, Conselve (IT); Paolo Menegoli, San Jose, CA (US)

(72) Inventors: Fabio Alessio Marino, Conselve (IT); Paolo Menegoli, San Jose, CA (US)

(73) Assignee: ETA Semiconductor Inc., San Jose, CA (US)

( * ) Notice: Subject to any disclaimer, the term of this patent is extended or adjusted under 35 U.S.C. 154(b) by 11 days.

(21) Appl. No.: 13/889,317

(22) Filed: May 7, 2013

(65) Prior Publication Data
US 2014/0332928 A1  Nov. 13, 2014

Related U.S. Application Data

(60) Provisional application No. 61/644,070, filed on May 8, 2012, provisional application No. 61/709,907, filed on Oct. 4, 2012, provisional application No. 61/772,461, filed on Mar. 4, 2013.

(51) Int. Cl.
*H01L 29/93* (2006.01)
*H01L 29/66* (2006.01)
(52) U.S. Cl.
CPC .......... *H01L 29/93* (2013.01); *H01L 29/66174* (2013.01)
USPC .......................................... 257/602; 361/277

(58) Field of Classification Search
USPC ........... 257/602; 361/277, 272, 278, 279, 280
See application file for complete search history.

(56) References Cited

U.S. PATENT DOCUMENTS

| 3,829,743 | A | | 8/1974 | Kohashi | |
|---|---|---|---|---|---|
| 5,982,608 | A | * | 11/1999 | Kalnitsky et al. | 361/288 |
| 6,407,412 | B1 | * | 6/2002 | Iniewski et al. | 257/107 |
| 7,247,918 | B2 | * | 7/2007 | Tateyama | 257/401 |
| 7,403,140 | B2 | | 7/2008 | Miyagi et al. | |
| 7,622,760 | B2 | * | 11/2009 | Ogawa et al. | 257/300 |
| 8,498,094 | B2 | * | 7/2013 | Marino et al. | 361/277 |

* cited by examiner

*Primary Examiner* — Thao P Le

(57) ABSTRACT

A novel semiconductor variable capacitor is presented. The semiconductor structure is simple and is based on a semiconductor variable capacitor with MOS compatible structure suitable for integrated circuits, which has at least three terminals, one of which is used to modulate the capacitance value between the other two terminals of the device, by increasing or decreasing its DC voltage with respect to one of the main terminals of the device. Furthermore, the present invention decouples the AC signal and the DC control voltage preventing distortion of the RF signal. The present invention describes a controllable capacitor whose capacitance value is not necessarily linear with its control voltage, but although possibly abrupt in its characteristic, is utilized to manufacture a semiconductor variable capacitor with digital control to improve its noise and linearity performance while maintaining high quality factor.

20 Claims, 10 Drawing Sheets

US 8,963,289 B2

DIGITAL SEMICONDUCTOR VARIABLE CAPACITOR

RELATED APPLICATION DATA

The present application claims priority from the following U.S. Provisional Patent Applications filed by the same applicants: U.S. 61/644,070, entitled "Semiconductor controllable capacitor" filed on May 8, 2012; U.S. 61/709,907, entitled "Transcap Semiconductor variable capacitor" filed on Oct. 4, 2012; U.S. 61/772,461, entitled "Variable Capacitor Circuit Applications" filed on Mar. 4, 2013.

BACKGROUND OF THE INVENTION

1. Field of the Invention

The present invention is in the field of semiconductor structures. The present invention is further in the field of semiconductor structures of variable capacitance devices. Particularly, it relates to a MOS type variable capacitance device for semiconductor circuits. The implementation is not limited to a specific technology, and applies to either the invention as an individual component or to inclusion of the present invention within larger systems which may be combined into larger integrated circuits.

2. Brief Description of Related Art

Semiconductor capacitors are one of the fundamental components for integrated circuits. A variable capacitor is a capacitor whose capacitance may be intentionally and repeatedly changed under the influence of DC bias voltages. Variable capacitors are often used in L-C circuits to set the resonance frequency, e.g. to tune a radio (therefore they are sometimes called tuning capacitors), or as a variable reactance, e.g. for impedance matching in antenna tuners.

A voltage-controlled capacitor is well known in the art as "varactor", in which the thickness of a depletion region formed in a pn-junction diode is varied by changing a reverse bias voltage to alter the junction capacitance. Any junction diode exhibits this effect (including pn-junctions in transistors), but devices used as variable capacitance diodes are designed with a large junction area and a doping profile specifically chosen to maximize the capacitance tuning range.

Their use is limited to low signal amplitudes to avoid obvious distortions as the capacitance would be affected by the change of signal voltage, precluding their use in the input stages of high-quality RF communications receivers, where they would add unacceptable levels of inter-modulation. At VHF/UHF frequencies, e.g. in FM Radio or TV tuners, dynamic range is limited by noise rather than large signal handling requirements, and varcaps are commonly used in the signal path. Furthermore an extremely high value of capacitance cannot be obtained even with a reverse bias because the reverse-biased saturation current is not exactly equal to zero.

Varcaps are used for frequency modulation of oscillators, and as reported in Miyagi et al. (U.S. Pat. No. 7,403,140) to make high-frequency voltage controlled oscillators (VCOs), the core component in phase-locked loop (PLL) frequency synthesizers that are ubiquitous in modern communications equipment. These components are intended for antenna impedance matching in multi-band GSM/WCDMA cellular handsets and mobile TV receivers that must operate over wide frequency ranges such as the European DVB-H and Japanese ISDB-T mobile TV systems.

Several prior art attempts to improve varactors performance, so as to effectively obtain high capacitance density and a linear dependence of the capacitance value over a wide range of control voltages, have been documented. In particular, an interesting solution is reported in Ogawa et al. (U.S. Pat. No. 7,622,760) where the synthesis of two MOS capacitor is used to obtain a good linearity over a wide range relative to the DC control voltage. However, the prior art described above discloses a varactor that is still a two terminal device, and its capacitance is varied by modulating the DC voltage between its two terminals. This leads to the disadvantage that the AC voltage is superimposed upon the DC control value, and therefore the capacitance value is distorted by the AC voltage.

There is therefore a need for a novel variable capacitor with at least three terminals, where at least one control terminal separated from the capacitance terminals is added to the component to introduce capacitance variability without interfering with the voltage across the main terminals of the capacitor. The novel structure should allow the control of the capacitance without overlapping the DC control voltage with the AC signal thus avoiding the distortion of the capacitance value during the circuit operation.

A similar approach, where a three terminal MOS varactor is used, is disclosed in Kohashi (U.S. Pat. No. 3,829,743). In this patent the author describes a variable capacitance device having a thin film of dielectric material in which the area of an equivalent plate electrode is varied by changing the voltage of the control terminal or under the influence of radiations. Referring to the drawings in Kohashi and more particularly to FIG. 1 and FIG. 2 of the cited patent, the variable capacitance device comprises a pn-junction diode placed directly above the dielectric film and a source of DC voltage. A lead wire made of gold or aluminum is placed in ohmic contact with an end surface of each of the p and n regions.

One lead is connected to the movable contact of a double-throw switch. The double-throw switch has two fixed contacts connected to two batteries, which in turn are connected together to the other lead placed in electrical contact with the n region. As shown, a thin film of high-insulation, low-dielectric-loss dielectric material is deposited on the side surface of the diode perpendicular to the junction. The described device uses the voltage between the n and the p regions of the pn-junction to modulate the depletion region above the oxide in order to change the overlap surface between the p and n regions with the metal plate under the oxide layer. FIG. 3 of the cited patent shows the structure resulting by the parallel of two structures as presented in FIG. 1.

The described structures can be used only for discrete components. As underlined by the author in the patent description, the structures are not suitable for integrated circuits. The integrated version of the structure shown in FIG. 1 is reported in FIG. 4. In this case, as in the previous one, both the depletion regions in the p and n regions are used to modulate the capacitance, which lead to a difficult control of the device performance and capacitance-voltage relation (the process variations of the p-region sum up with the one of the N region and to the variability on the position of the pn-junction).

Furthermore, in all these structures, the DC voltage is applied between one terminal of the capacitance and a region directly in contact with the capacitance dielectric layer overlapping the metal terminal 27 in FIG. 1 (or 45 in FIG. 3), causing a distortion of the capacitance value due to the modulation of the MOS capacitance. By varying the DC voltage between the p and n regions, also the DC voltage drop between one of these two regions and the metal terminal changes, and that causes an enhancement or depletion of the semiconductor surface affecting the capacitance value.

The last structure of interest disclosed in Kohashi is the one illustrated in FIG. 14 of the cited document. In this case the variable capacitance is the resulting synthesis of the series of the capacitances of the pn-junctions and a MOS structure. The capacitor terminals 190 and 193 are coupled through a p+/n junction and the MOS capacitance. In this case the resulting capacitance and its range of variation are therefore very low. Furthermore, in this configuration the capacitance depends also on the thickness of the depletion regions of the two p+/n junction as in conventional diode based varactors, leading to high distortion of the capacitance value. Finally, it is important to notice that none of the structures described in Kohashi has a linear relation between the control voltage and the capacitance value.

Ideally, an analog component, where the relation between the control voltage and the capacitance value is linear, would be desirable for adaptive linear control of feedback systems, however this is difficult to achieve because many factors contribute to the non uniform variation of capacitance with the control voltage. Nevertheless a more digital approach, where the capacitance value is abruptly varied between its lowest and largest value, is desirable as well, because many small digital capacitors coupled in a parallel to form a capacitive array may result in a larger capacitor where its value is selected and modified in a discrete fashion.

The present invention is simple, much less sensitive to process variations with respect to the structures described above, it is suitable for integrated circuits and presents a high capacitance density value. In the present invention the variation of the DC control voltage, in theory, does not affect the voltage applied between the two capacitance plates, therefore enabling an excellent control of the device characteristic. Furthermore, the present invention exhibits high Q (quality factor) value of the component. All these characteristics are extremely important for the practical implementation of the present invention and clearly distinguish the present invention from the varactors devices used nowadays in the integrated-electronic industry and in particular in radio-frequency applications.

It is a purpose of the present invention to describe a novel structure of a semiconductor controllable capacitor suitable for integrated circuits with at least three terminals, simple, cost effective and immune to process variations, which offers the advantages of high capacitance per unit area, wide control range, high Q and very low distortion of the RF signal applied to the capacitor.

SUMMARY OF THE INVENTION

The present invention describes a digital semiconductor variable capacitor, named digital transcap, suitable for integrated circuits, which has at least three terminals, one of which is used to modulate the capacitance value between the other two terminals of the device, by increasing or decreasing its DC voltage with respect to one of the main terminals of the device. Furthermore, the present invention decouples the AC signal and the DC control voltage thus avoiding distortion of the applied RF signal and increasing the performance of the device, such as control reliability. The present invention is simple and only slightly dependent on the variations related to the process manufacturing. It exhibits a high value of capacitance density and quality factor (Q).

The main concept of the present invention stems from the semiconductor variable capacitor described in the provisional patent application U.S. 61/644,070 for "Semiconductor controllable capacitor", filed by the same applicants on May 8, 2012. Furthermore, the present patent application claims priority from the following U.S. provisional patent applications, also filed by the same applicants: U.S. 61/709,907 for "Transcap Semiconductor variable capacitor" filed on Oct. 4, 2012, and U.S. 61/772,461 for "Variable Capacitor Circuit Applications" filed on Mar. 4, 2013.

The novel variable capacitor exhibits an abrupt characteristic such that above a threshold of the control voltage the device has low capacitance and below the threshold it offers a large value of capacitance. This arrangement has the advantage of significantly reducing the noise susceptibility of the component since its value would not be much dependent on its control voltage well below and/or well above the threshold of the digital variable capacitor.

A smooth and controlled value of the capacitor may be obtained by connecting in parallel n small digital variable capacitors, and switching each of them in a digital way between a high and a low capacitance value in order to obtain the desired total capacitance value. As well known to anyone skilled in the art, many configurations can be used to connect and drive a multiplicity of digitally controlled variable capacitors in order to obtain a variable capacitor with multiple discrete capacitance values. A particular interesting configuration is shown in FIG. 1, where n capacitors are connected in parallel and have been opportunely sized (the i-th capacitor is $2^{i-1}$ times the first one), so that the total number of capacitance values that can be obtained is $2^n$. In the illustrated configuration, as an example, if each capacitor has a tuning range of 1:10 and the maximum total capacitance is 10 pF, with 5 capacitors it is possible to obtain 32 capacitance values, corresponding to a discretization step of 0.3125 pF.

A digital transcap device is a semiconductor variable capacitor with at least three terminals, where the capacitance between the two main terminals of the device (C1 and C2) can be varied in a digital way by changing the DC voltage applied between the control terminal Ctrl and one of the other two main terminals (C2). This characteristic allows the decoupling of the AC signal from the DC control voltage thus preventing distortion and increasing the performance of the device, such as control reliability. A transcap device can be implemented with several semiconductor structures. Each one of them has advantages and disadvantages as discussed in the following.

The main principle of operation of the present invention can be understood by envisioning a capacitor with a thick conductive plate, whereby, by changing the voltage of the control terminal, a new dielectric is inserted in this conductive plate thus splitting the capacitor into two series capacitors, therefore reducing the overall main capacitance. In particular, if the new series capacitor is small enough, the overall capacitor is significantly reduced thus achieving a large tuning range. This phenomenon of inserting a new dielectric layer into an existing conductive plate is quite abrupt because the net effect is not very evident until the dielectric is extended throughout the whole capacitor active surface.

This inherent abrupt effect is at the base of the "digital" behavior of the described variable capacitor. The equivalent dielectric layer, that divides the capacitor into two smaller series capacitors when a small value capacitance is desired, is obtained by modulating the depletion region extension within a doped semiconductor region used as an equivalent conductive plate of the device.

In order to better understand this concept, let us consider the structure illustrated in FIG. 2, which represents a cross-section of the first embodiment of the present invention. As it can be seen, the semiconductor device illustrated has three terminals: the C1 terminal 2, the C2 terminal 7 and the control terminal 11. The two terminals 2 and 7 are associated to the variable capacitance and are named C1 and C2, respectively, whereas the control terminal 11 is used to modulate the capacitance value.

As it can be seen in FIG. 2, the structure of a digital transcap device is very simple and is obtained from the one of a MOS capacitor by adding the following modifications: i) a n+ implantation 8 and a p+ implantation 10 are formed on the two sides of the MOS structure in order to create a pn junction to modulate the depletion region within the semiconductor capacitance plate 6, ii) a n+ implantation 5 has been added underneath the dielectric layer 4, in order to minimize the modulation of the carrier population at the semiconductor-oxide interface by the RF signal applied between C1 and C2, iii) it is preferable to have the highly doped implantations not auto-aligned with the MOS structure (especially the n+ region 8) in order to minimize the parasitic capacitance associated with the control region 10 and to improve the isolation of the n+ region 8 for high control voltages, iv) the two highly doped regions 8 and 10 are formed in recessed regions in order to optimize the device performance, v) The substrate 9 is properly chosen in order to maximize the device performance (e.g. this can be an insulator, semi-insulator or an intrinsic/near-intrinsic semiconductor in order to decrease the parasitic capacitances associated with the substrate or it can be made using n-doped or p-doped semiconductor with an appropriate doping profile in order to maximize the control on the depletion region within the n-doped region 6 and/or the device quality factor).

Assuming that the C2 terminal is connected to ground (not shown in figure), if the control voltage of the control terminal 10 is set to 0V, the depletion region of the pn-junction, formed by the region 8 and the well 6, is very small. It follows that the capacitance between the C1 terminal 2 and the C2 terminal 7 will have its maximum value of:

$$C = \frac{\varepsilon_{ox}}{d} W * L,$$

where $\varepsilon_{ox}$ and d are, respectively, the dielectric constant and the thickness of the insulating layer 4, W is the width of the MOS capacitor and L is its length.

If the voltage of the control terminal 10 is increased towards negative values, the depletion region of the pn-junction widens. If the voltage applied across the two terminals 10 and 8 achieves a certain threshold value, the depletion region across the pn junction completely interrupts the conduction path between the terminal C2 and the n+ implantation 5. When this happens, a very small capacitance formed by the n+ doped region 5, the depletion region and the highly doped region 8 is inserted in series to the main MOS capacitance, greatly reducing the total capacitance value seen between the C1 and C2 terminals. This particular situation is illustrated in FIG. 3 where a schematic representation of the depletion region 12 of the pn junction is shown.

Differently from conventional MOS capacitors and prior art varactors described above, where the capacitance between the two main terminals is defined only by the DC bias applied across the capacitance, in the present invention the capacitance value is determined by the bias of the third terminal 11 which modulates the depletion region between the control region 10 and the n+ doped region 8.

The capacitance value depends only on the extension of the depletion region within the n-well 6, which is well controllable. This characteristic dramatically reduces the device dependence on the process variations. Furthermore, the variation of the DC voltage of the control terminal 11 nor alters the DC voltage between the two terminals C1 and C2 of the capacitance, neither alters the DC voltage between any region directly in contact with the dielectric layer, allowing an optimum control of the device characteristic.

The illustrated structure requires the use of a negative control voltage due to the chosen doping profiles. The dual version can also be obtained (by reversing all the doping polarities) in order to use a positive control voltage. However, the dual configuration has a lower quality factor with respect to the illustrated version due to the lower mobility of a p-doped layer with respect to n-doped semiconductors.

In FIG. 4 the characteristic resulting by the simulation of the structure described in the previous figures is reported. As it can be seen, the capacitance, represented by graph 13 changes in a digital fashion between 8.5 pF and 1 pF, when the control voltage is varied between 0V and −30 V. In the same plot is reported also the Quality factor, represented by graph 14, of the device, which has been calculated and plotted by using the following formula:

$$Q = \frac{1}{2\pi f * ESR * C}$$

where ESR and C are, respectively, the equivalent series resistance and the capacitance seen between C1 and C2, and f is the frequency of the RF signal, which has been set to 2 GHz in this analysis.

In order to increase the capacitance range, a second control region can be added to the structure as shown in FIG. 5. In this device the capacitance between the C1 terminal 15 and the C2 terminal 24 is varied by applying a DC voltage between the two control terminals 19 and 26 (which can be short-circuited or biased at the same voltage in order to simplify the control circuitry) and the C2 terminal 24. In this case the total depletion width is doubled, and the control voltage required to modulate the capacitance is reduced.

Many doping profiles can be used in order to optimize the device performance. For example, in FIG. 6 is depicted a further embodiment of the present invention, where a p+ buried implantation 36 has been added to the structure in order increase the control on the depletion region in the n well 32.

If a more planar configuration is preferred with respect to the ones discussed above, the embodiment of FIG. 7 can also be used. In this structure, two Shallow Trench Isolations (STI) 42 and 49 have been placed on the sides of the MOS structure in order to avoid the additional etching process step required by the previous embodiments. However, in this case, the total capacitance variation may be smaller and the control voltage required to guarantee the isolation of the C2 terminal 43 from the n+ region 50 underneath the dielectric 41 may increase due to the geometry of the device. In this case it is preferable to make the n+ implantation 50 under the dielectric 41 as thin as possible in order to minimize the required control voltage.

By using a similar approach, any of the embodiments discussed above can be implemented in a planar configuration. For example, in FIG. 8 is reported the planar version of the embodiment of FIG. 5 obtained by using two STI regions instead of etching the silicon surface of the device. As well known to anyone skilled in the art, STI regions can be added in all the embodiments herein described in order to increase the isolation between the different regions of the device.

Another interesting embodiment of the present invention, is illustrated in FIG. 9, where a p+ buried implant 67 is used to control the depletion region and therefore the value of the overall capacitance between C1 and C2. When a reverse voltage is applied between C2 and the control terminal 69, the depletion region extends vertically in the n-well 66 until it isolates the n+ region 70 from the n+ region 65 under the dielectric layer 64. As shown in figure, a second (optional) control region 72 can also be added to the structure in order to optimize the tuning range of the device.

In order to increase the depletion region width and therefore improve the capacitance range, the embodiment of FIG. 10 can be used. However, in this case, particularly attention must be paid to the parasitic capacitance between the control terminals 77 and 84, and C1, which can lead to a-degradation of the overall performance of the device.

As shown in FIG. 11, the buried implantation can be spared by building the described invention in Semiconductor On Insulator (SOI) technology. However, the availability in the utilized semiconductor process technology of buried implantations can increase the degrees of freedom in the design of the semiconductor structure, allowing an improvement of the device performance.

In all the embodiment discussed above, it is possible to add an extra terminal contacting the n+ region under the C1 oxide in order to improve the device performance. An example of implementation of this configuration is shown in FIG. 12, where the Ctrl2 terminal 105 has been added on the left side of the MOS structure. In many of the described embodiments, this fourth terminal can also be added in the direction perpendicular to the illustrated cross-section in order to simplify the device layout.

If desired, in all the structures described above, the MOS structure can be replaced with a Metal Insulator Metal (MIM) capacitor, so as to optimize the linearity of the system and simplify the fabrication process. An example of implementation of such configuration is illustrated in FIG. 13, where an extra metal layer 116 has been placed between the n+ region 115 and the dielectric layer 117, so as to replace the MOS capacitor with a MIM capacitor.

In many of the described embodiments, the p+ region can be replaced by a Schottky contact and/or one or more of the n+ regions can be replaced with a metal ohmic contact. In the case where a Schottky contact is used in combination with a III-V semiconductor material process technology, an extra wide energy-gap layer can be interposed between the metal and the n-doped semiconductor in order to reduce the current leakage associated with the Schottky contact. Furthermore, the control pn-junction can be formed with a super-junction profile, i.e. a series of alternating p and n stripes, in order to increase the breakdown voltage of the junction itself.

All the described embodiments can be built in many different technologies, comprising: Bulk, Silicon On Insulator, Silicon On Sapphire or III-V technology with or without hetero-junctions. It is important to notice that, if the present invention is realized in III-V semiconductor material technology, the capacitance dielectric layer under the C1 terminal, can also be replaced with a wide band-gap semiconductor layer (such as AlGaAs or GaAs) in order to avoid the formation of dielectric/semiconductor interfaces, which can exhibit high defect densities in III-V compounds technologies.

All the embodiments illustrated above can be realized both as discrete or integrated components with minimal changes. For each one of them, the dual version can be obtained by simply substituting the n-doped implants with p-type ones and vice-versa. Many other configurations can be obtained combining the different embodiments and their variants as generally known to anyone skilled in the art.

The parasitic capacitances between the control terminal and the other terminals of the capacitor play a very important role in the overall device performance. In fact, if a DC voltage is applied between the control terminal and the reference terminal C2, these two terminals may be considered AC shorted one to the other. This effect reduces the capacitance seen from C1 to the parallel of the capacitance C1-C2 (between the main two terminals) with the parasitic capacitance C1-Ctrl (between the control terminal and the non-reference terminal). The net adverse effect may be a significant reduction of the overall tuning range.

To minimize this effect it may be convenient to connect an impedance (e.g. a resistor and/or an inductor) of proper value in series to the control terminal to decouple in DC the control terminal from the DC voltage source so that the mentioned parasitic capacitance does not end up being AC coupled in parallel to the main capacitance. However this control technique may cause the control voltage to vary with the RF signal and, as a consequence, the capacitance value of the capacitor to be modulated with the signal itself.

FIG. 14 illustrates the most conventional control configurations of a digital transcap with three terminals, similar configurations can be also used in the case of a four-terminal device as the one shown in FIG. 12. As shown in FIG. 14(a), a high value resistor HR can be placed in series to the Ctrl terminal in order to bias the device control terminal without affecting the RF performance of the device.

FIG. 14(b) shows a possible variant of this configuration, where two anti-parallel diodes have been inserted in series to the high impedance HR in order to increase the AC de-coupling between the DC bias and the control terminal of the transcap device. A similar approach can be utilized for all the control configurations herein disclosed. Furthermore, the HR resistor can also be replaced by an inductor as shown in FIG. 14(c).

As it can be seen, the conventional control configurations have several drawbacks: i) it is preferable to have the C2 terminal of the transcap device connected to ground to avoid complicated control configurations, ii) the control voltage is negative (when an n-region as a main body of the device), iii) the RF signal drops entirely across C1 and C2 limiting the linearity of the system, iv) the RF signal can partially propagate through the control terminal leading to undesired signal distortion.

Some of these problems can be solved by adding a series capacitor $C_{series}$ between the transcap device and one of the RF terminals. In FIGS. 15(a) and 15(b) two examples of implementation of this control configuration for the three-terminal and the four-terminal transcap devices are shown, respectively. In the illustrated cases, the control terminal of the transcap device can be coupled through a high impedance to ground (or to a bias DC source), and the middle node (obtained by coupling the C2 terminal to the series capacitance) can be used to modulate the total capacitance seen by the RF signal, by applying a positive DC bias. This configuration is suitable for both shunt or series tuning capacitor configurations.

An even better performing approach is shown FIG. 16(a), where two transcap devices TC1 and TC2 are connected back-to-back and the control terminals are biased through two high impedances. The middle node, obtained by coupling the two C2 terminals, effectively becomes a third control terminal, which can also be used to modulate the capacitance seen by the RF signal. As shown in FIG. 16(b) a similar configuration can also be obtained in the case where a fourth terminal has been added to the structure.

The differential series (DS) resulting from the connection back-to-back of two three-terminal transcap devices can be seen as a single device with 5 terminals (RF+, RF−, DS C2, DS Ctrl1, DS Ctrl2), where two of them (RF+ and RF−) are dedicated to the RF signal and three (DS C2, DS Ctrl1, DS Ctrl2) are used to modulate the capacitance value seen between RF+ and RF−. Similar considerations hold true for the connection back-to-back of two four-terminal transcap devices, with the difference that in this case the final device will have 7 terminals.

FIG. 17 shows an example of implementation of the described series approach, where two three-terminal transcap structures resembling the one of FIG. 11 have been connected back-to-back in series to form an integrated 5 terminal device.

FIG. 18 illustrates another possible implementation of the series approach by using the building block of FIG. 12. It is important to notice that the differential-series configuration can be utilized with all the transcap structures herein described and their variants, by connecting two of them back-to-back in series. In general, the ratio between the two transcap structures composing the differential-series configuration can be made different from unity in order to cancel or minimize distortion effects, and improve the linearity of the system.

FIG. 19 shows two further possible configurations that can be used to bias the different terminals of a DS transcap device. As it can be seen, in both configurations, the DS Ctrl1 and DS Ctrl2 terminals have been coupled to ground through high impedances, and the central control terminal C2 has been used to modulate the device capacitance between RF+ and RF− terminals. A MOS transistor can also be connected in parallel to each one of the high impedances used to bias the device terminals in order to speed up the tuning speed of the transcap device (i.e. the MOS devices are always off except during the transitions of the control voltage).

Due to the differential nature of this structure, the distortion induced by the presence of the parasitic capacitances between the control terminals and the RF terminals, is minimized, in particular the even harmonics of the signal are quite linear. The RF signal propagates both in the C2 terminal and in the DS Ctrl1 and DS Ctrl2 terminals, such as its net effect on "$V_{Ctrl}-V_{C2}$" is minimized for both transcaps.

In principle, the DS Ctrl1 and DS Ctrl2 terminals can also be shorted together, however this approach can significantly degrade the device tuning range, especially in the case where the capacitance between Ctrl1 and C2 (and/or between Ctrl2 and C2) is comparable to the one between C2 and RF+ (and/or between C2 and RF−) as in the case of an SOI process with a thin silicon active layer (in this case, the shortening of the two controls terminals Ctrl1 and Ctrl2 can lower the tuning range by a factor greater than 2).

As shown in FIG. 20, by repeatedly using the control configurations of FIG. 19, more structures can be placed in series by short-circuiting the resistors coupled to the DS C2 terminals, in order to withstand higher RF voltages.

As it is clear to those skilled in the art, the basic system of the present invention can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

Figure 1:
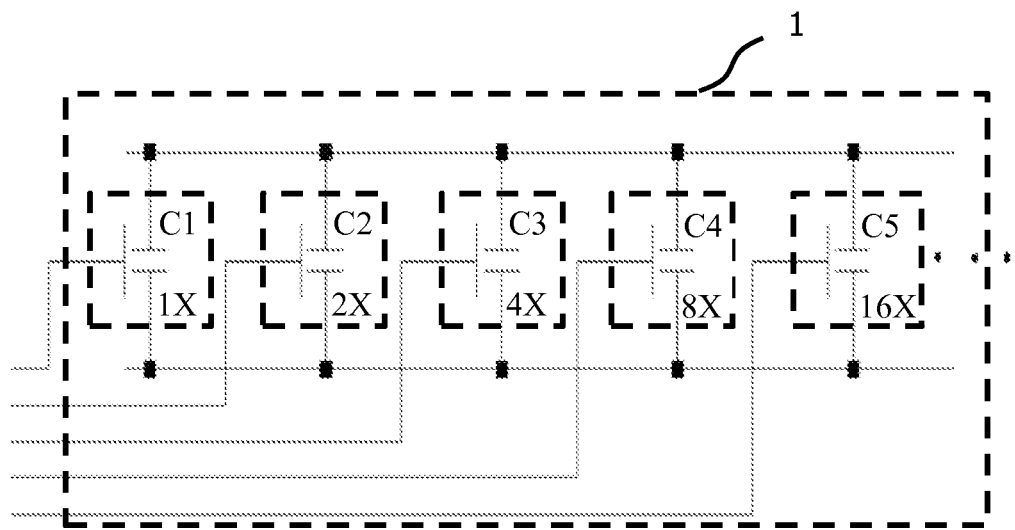
FIG. 1 shows a schematic of a digitally controlled variable capacitor, where n digital transcap devices opportunely sized (the i-th capacitor is $2^{i-1}$ times the first one) have been placed in parallel in order to create a variable capacitor with $2^n$ discrete values.

FIG. 1 is showing a schematic of a digitally controlled variable capacitor, where n digital transcap devices opportunely sized (the i-th capacitor is $2^{i-1}$ times the first one) have been placed in parallel in order to create a variable capacitor with $2^n$ discrete values. In the illustrated configuration, as an example, if each capacitor has a tuning range of 1:10 and the maximum total capacitance is 10 pF, with 5 capacitors it is possible to obtain 32 capacitance values, corresponding to a discretization step of 0.3125 pF. As well known to anyone skilled in the art, many other configurations can be used to connect and drive a multiplicity of digitally controlled variable capacitors in order to obtain a variable capacitor with multiple discrete capacitance values.

B FIG. 2

Figure 2:
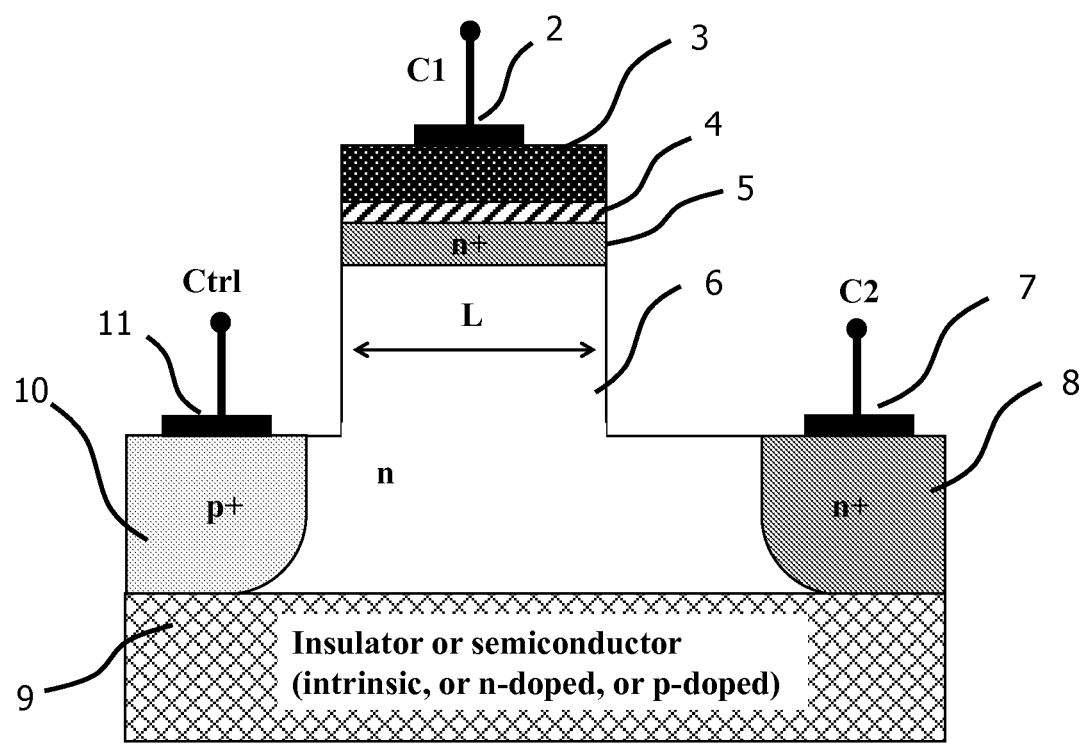
FIG. 2 shows a cross section view of a semiconductor variable capacitor according to a first embodiment of the invention.

FIG. 2 is showing the first embodiment of the present invention as described in the provisional patent application U.S. 61/644,070 entitled "Semiconductor controllable capacitor", filed by the same applicants on May 8, 2012. The $p^+$ region 10 defines the control terminal of the device whereas the region 3 and the n+ region 8 are the two terminals of the capacitor. Region 4 corresponds to the capacitor dielectric layer (which can be replaced with a wide band-gap semiconductor layer if desired), whereas region 6 is a n-type semiconductor layer. The lower capacitance plate is constituted by the neutral portion of the semiconductor region 6, and it is connected to the C2 terminal 7 through the n+ region 8. The C1 electrode 3 may be built in poly-silicon or metal.

C FIG. 3

Figure 3:
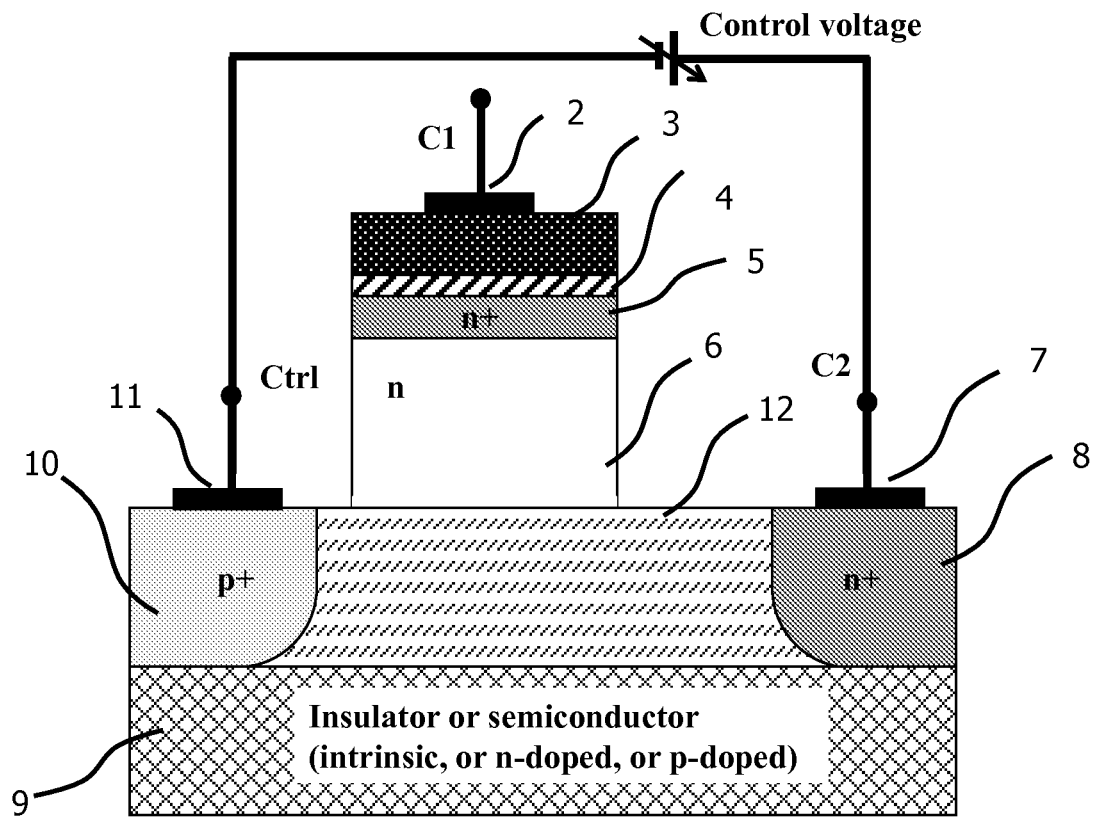
FIG. 3 shows the operating principle of the semiconductor variable capacitor illustrated in FIG. 2.

FIG. 3 is depicting the operational principle of the semiconductor variable capacitor of FIG. 2, whereby the depletion region across the pn junction completely interrupts the conduction path between the terminal C2 and the n+ implantation 5. When this happens, a very small capacitance formed by the n+ doped region 5, the depletion region and the highly doped region 8 is inserted in series to the main MOS capacitance, greatly reducing the total capacitance value seen between the C1 and C2 terminals. In particular, if the new series capacitor is small enough, the overall capacitor is significantly reduced thus achieving a large tuning range.

D FIG. 4

Figure 4:
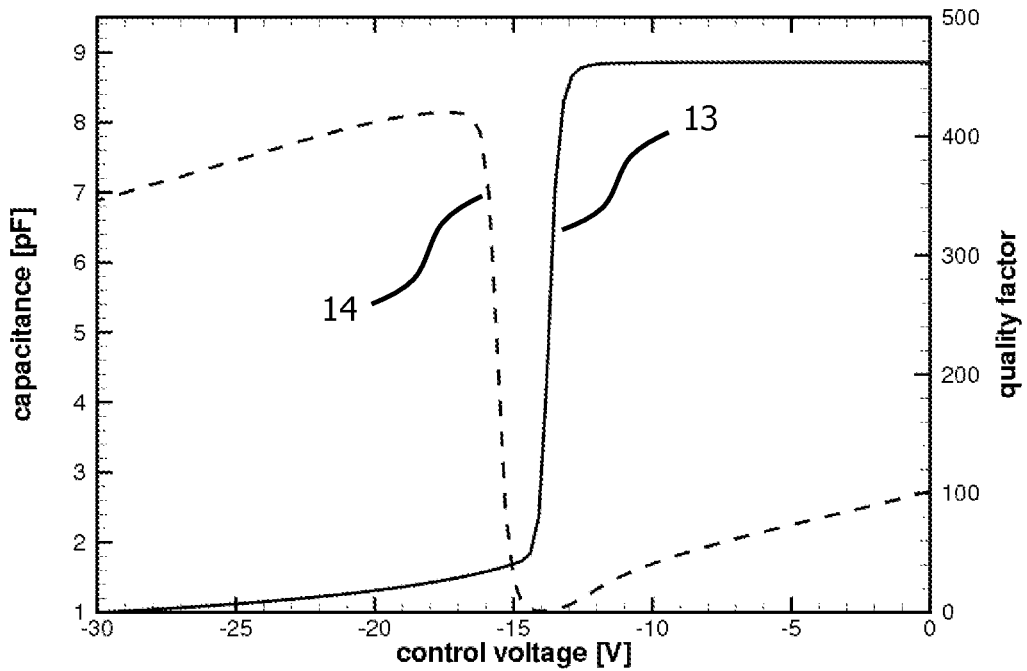
FIG. 4 shows the capacitance value and the quality factor as a function of the control voltage as obtained from the numerical simulation of the embodiment of the invention illustrated in FIG. 2.

FIG. 4 shows an example of CV characteristic of a transcap device implemented according to the embodiment of FIG. 2. In this plot, the capacitance 13 between the C1 and C2 terminals and the quality factor 14 of the device (for a 2 GHz RF signal) are shown as a function of the control voltage.

E FIG. 5

Figure 5:
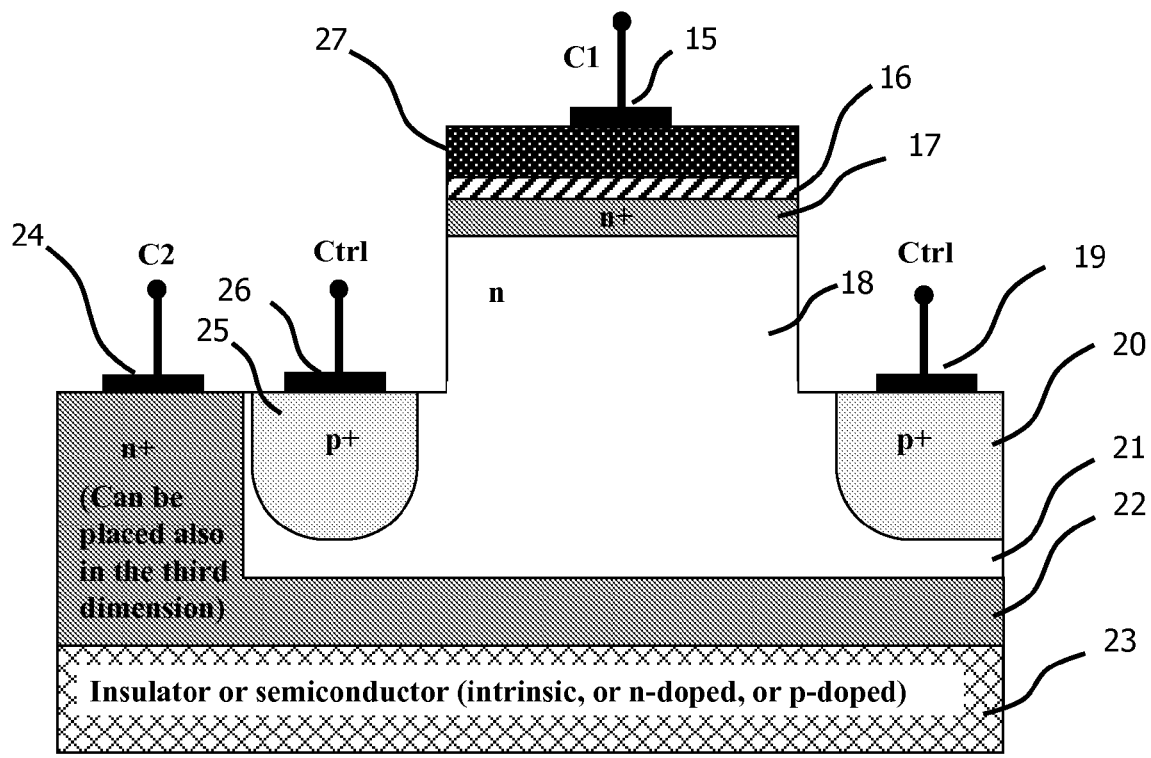
FIG. 5 shows a cross section view of a semiconductor variable capacitor according to a further embodiment of the invention, where a second control region and a buried implantation have been added to the structure.

FIG. 5 is depicting the cross-section view of a semiconductor variable capacitor according to a further embodiment of the invention. This structure is similar to the one shown in FIG. 2, with the difference that a second control region 25 has been added to the structure. The presence of region 25 allows for the reduction of the voltage required to deplete the semiconductor area within the n region 18. In order to avoid the reduction of the quality factor of the structure due to the insertion of the second control region 25, the C2 n+ implantation can be placed in the third dimension, i.e. in the direction perpendicular to the cross section shown in FIG. 5, or/and a n+ buried implantation can be added to the structure as shown in figure.

F FIG. 6

Figure 6:
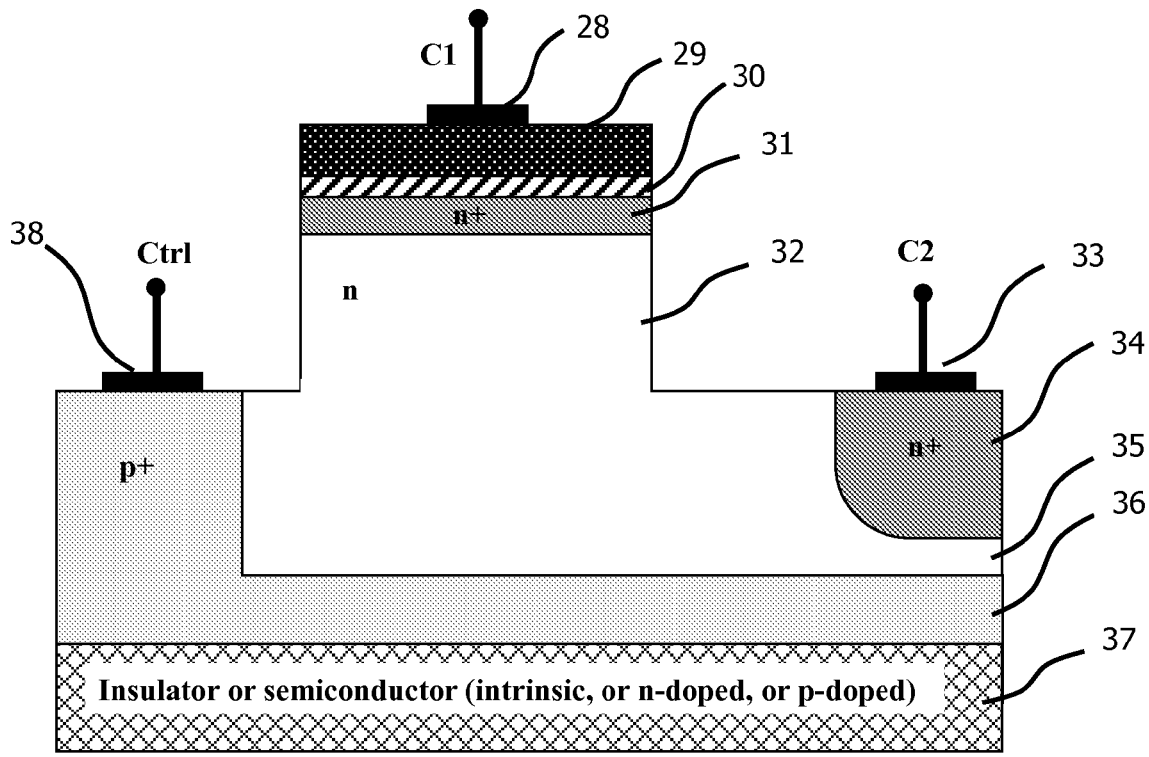
FIG. 6 shows a cross section view of a semiconductor variable capacitor according to a further embodiment of the invention, where a p+ buried implantation has been added to the structure in order to improve the control on the depletion region under the C1 terminal.

FIG. 6 is depicting the cross-section view of a semiconductor variable capacitor according to a further embodiment of the invention, where the control of the depletion region within the n-doped region 32 has been increased by adding a p+ buried implantation. This configuration is preferable with respect to the one shown in FIG. 5, since the quality factor can be maximized maintaining a high control on the depletion region.

G FIG. 7

Figure 7:
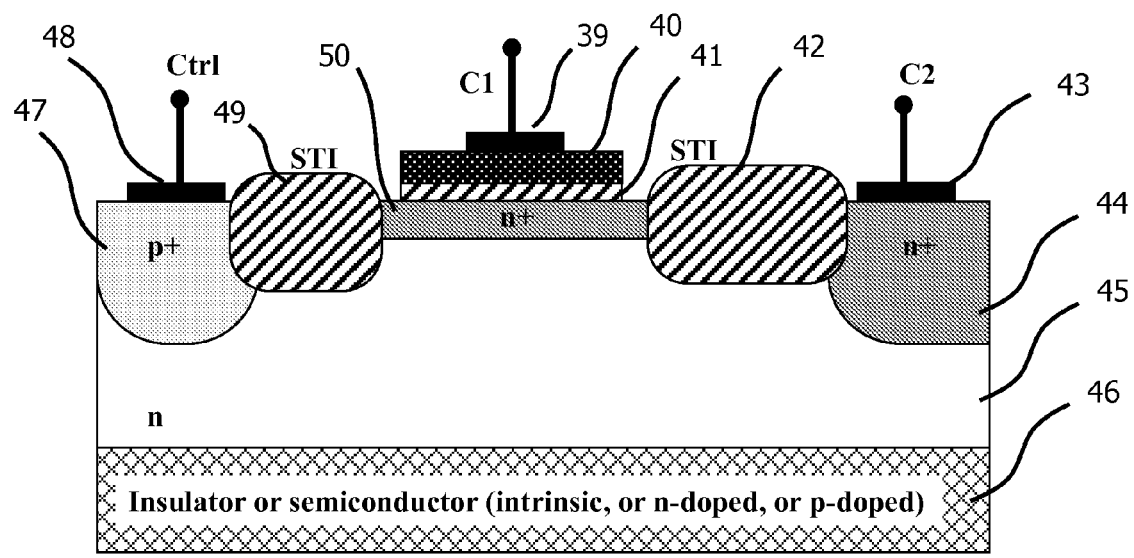
FIG. 7 shows a cross section view of a semiconductor variable capacitor according to a further embodiment of the invention, where two shallow trench isolations have been added to the structure in order to avoid the use of the additional semiconductor etch process steps during the fabrication of the device.

FIG. 7 is depicting the cross-section view of a semiconductor variable capacitor according to a further embodiment of the invention, where shallow trench isolation regions 42 and 49 have been created at the edges of the C1 terminal in order to allow for an improved isolation of the n+ region 44 for high control voltages without requiring semiconductor etch process steps. In general, a STI region can also be created only on the Ctrl terminal side or only at the C2 terminal side, depending on the process characteristics and performance requested by the application.

H FIG. 8

Figure 8:
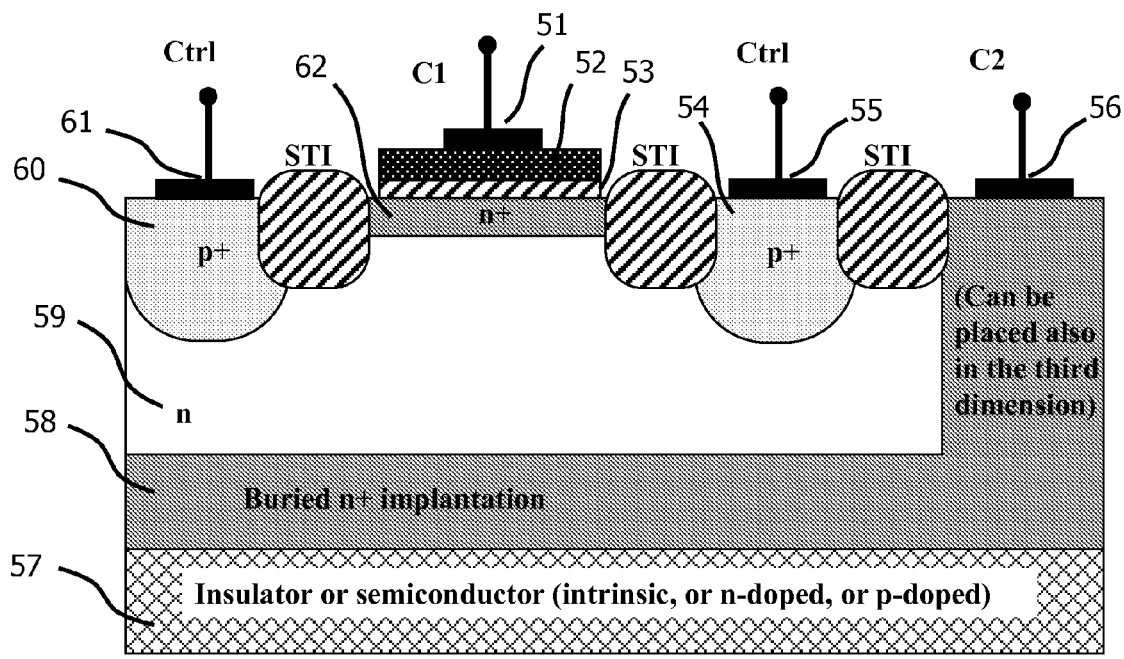
FIG. 8 shows a cross section view of a semiconductor variable capacitor according to a further embodiment of the invention similar to the embodiment of FIG. 7, where a second control region and a buried implantation have been added to the structure.

FIG. 8 is depicting the cross-section view of the planar version of the embodiment of FIG. 5 obtained by using two STI regions instead of etching the silicon surface of the device. As well known to anyone skilled in the art, STI regions can be added in all the embodiments herein described in order to increase the isolation between the different regions of the device.

I FIG. 9

Figure 9:
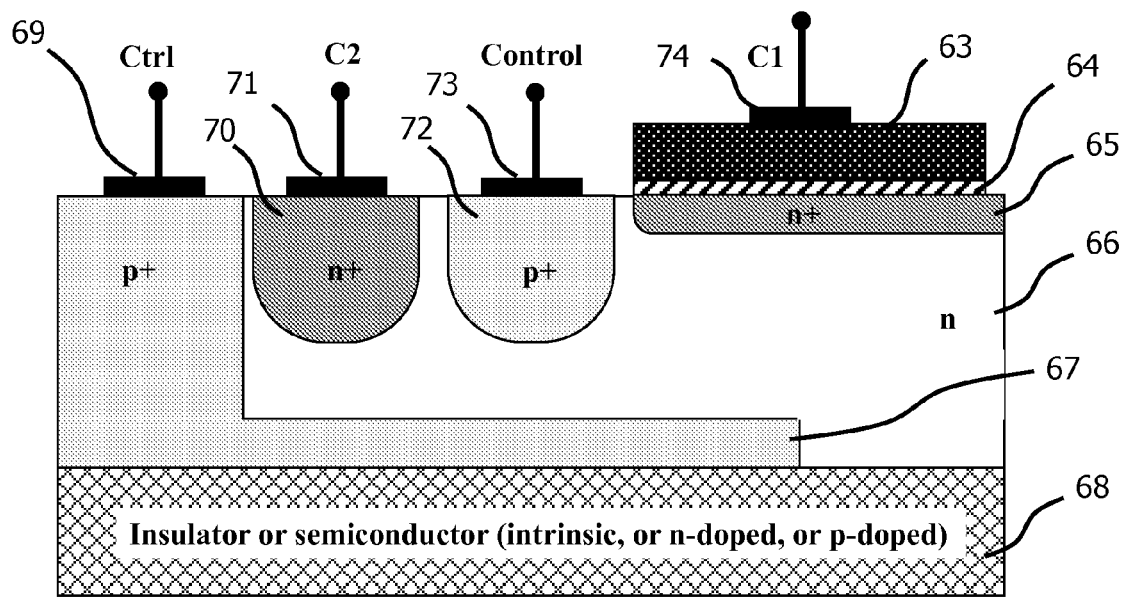
FIG. 9 shows a cross section view of a planar semiconductor variable capacitor according to a further embodiment of the invention, where the vertical extension of the depletion regions is exploited to operate the device.

Another interesting embodiment of the present invention, is illustrated in FIG. 9, where a p+ buried implant 67 is used to control the depletion region and therefore the value of the overall capacitance between C1 and C2. When a reverse voltage is applied between C2 and the control terminal 69, the depletion region extends vertically in the n well 66 until it isolates the n+ region 70 from the n+ region 65 under the dielectric layer 64. As shown in figure, a second (optional) control region 72 can also be added to the structure in order to decrease the minimum capacitance value and optimize the tuning range of the device.

J FIG. 10

Figure 10:
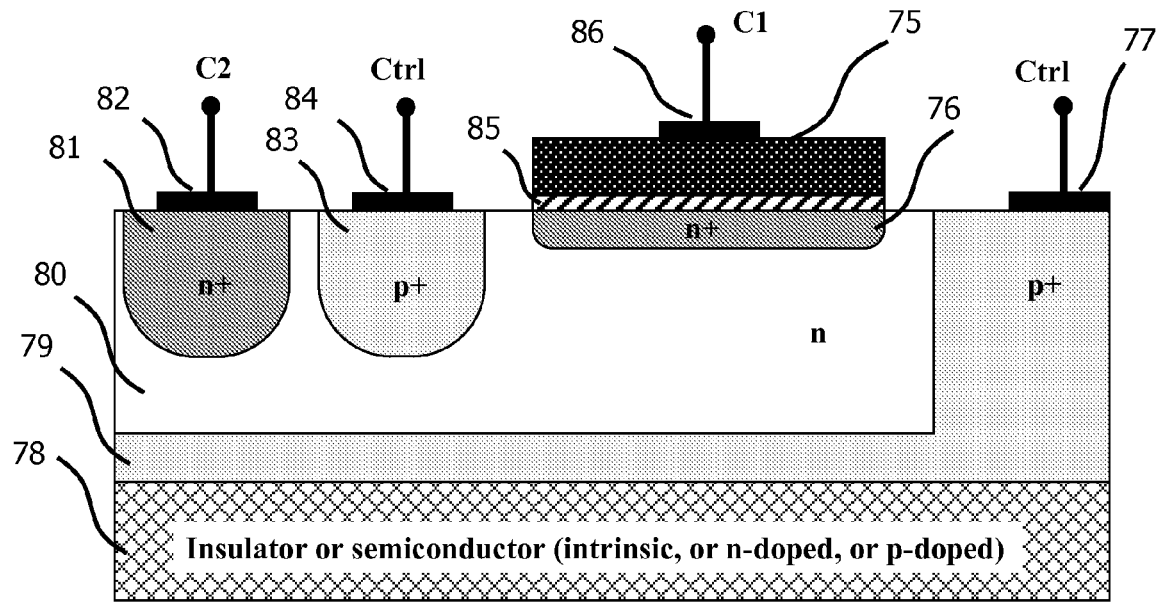
FIG. 10 shows a cross section view of a planar semiconductor variable capacitor according to a further embodiment of the invention, where the deep implantation of the p+ buried region has been moved to the left of the MOS structure.

In order to increase the depletion region width and therefore improve the capacitance range, the embodiment of FIG. 10 can be used. However, in this case, particularly attention must be paid to the parasitic capacitance between the control terminals 77 and 84, and C1, which can lead to a degradation of the overall performance of the device.

K FIG. 11

Figure 11:
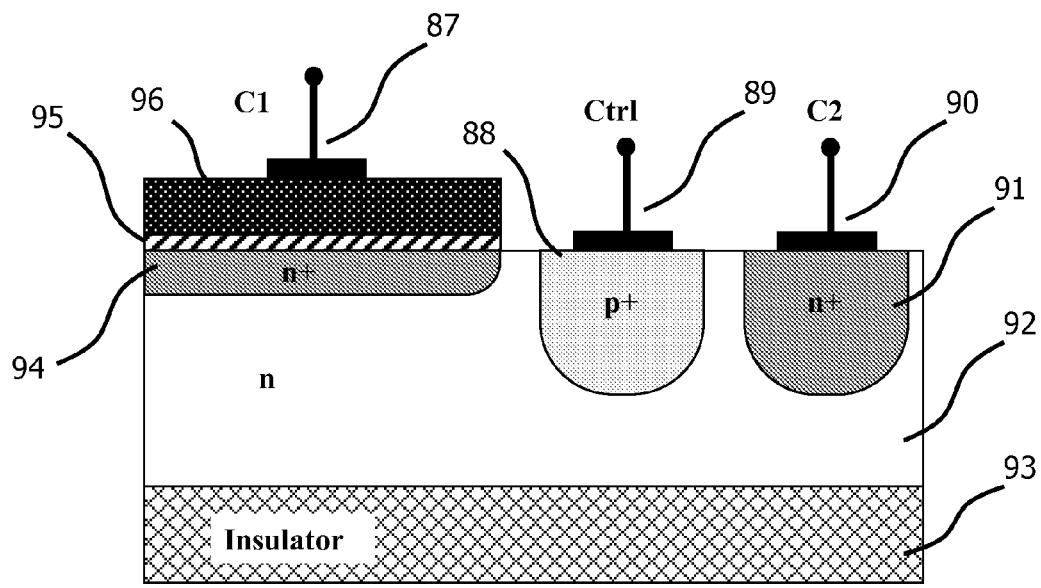
FIG. 11 shows a cross section view of a semiconductor variable capacitor according to a further embodiment of the invention, realized in SOI technology.

FIG. 11 is depicting the cross-section view of a semiconductor variable capacitor according to a further embodiment of the invention, where the buried implantation has been spared by building the described invention in Semiconductor On Insulator (SOI) technology.

L FIG. 12

Figure 12:
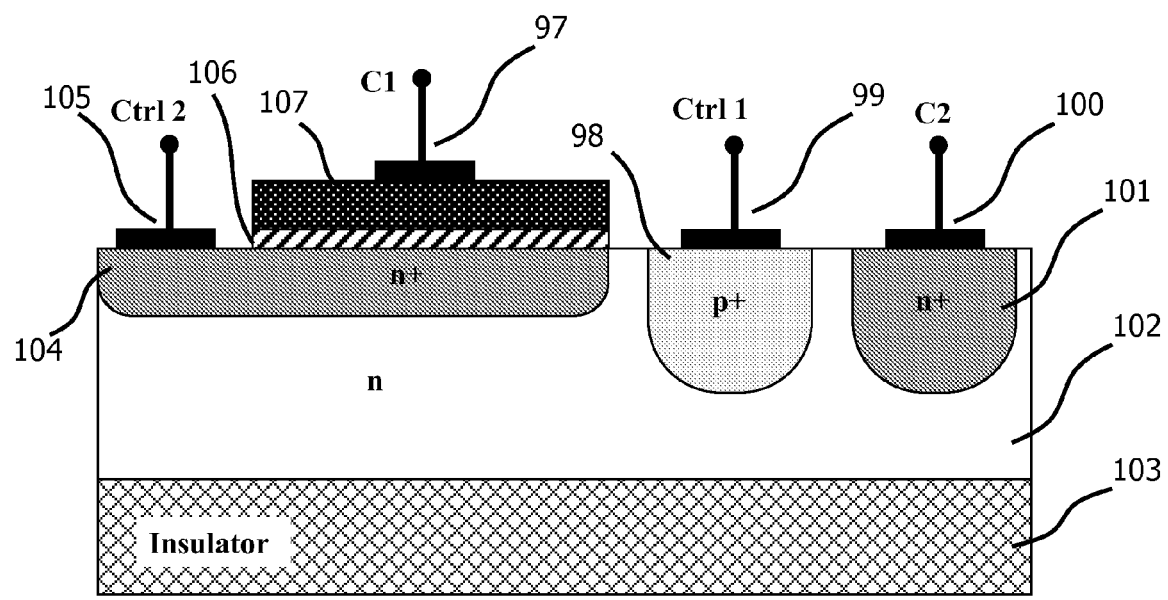
FIG. 12 shows a cross section view of the preferred embodiment of the present invention, where a fourth terminal has been added to the structure in order to contact the n+ region under the C1 oxide.

In all the embodiment discussed above, it possible to add an extra terminal contacting the n+ region under the C1 oxide in order to improve the overall device performance. An example of implementation of this configuration is shown in FIG. 12, where the Ctrl2 terminal 105 has been added on the left side of the MOS structure. In many of the described embodiments, this fourth terminal can also be added in the direction perpendicular to the illustrated cross-section in order to simplify the device layout.

M FIG. 13

Figure 13:
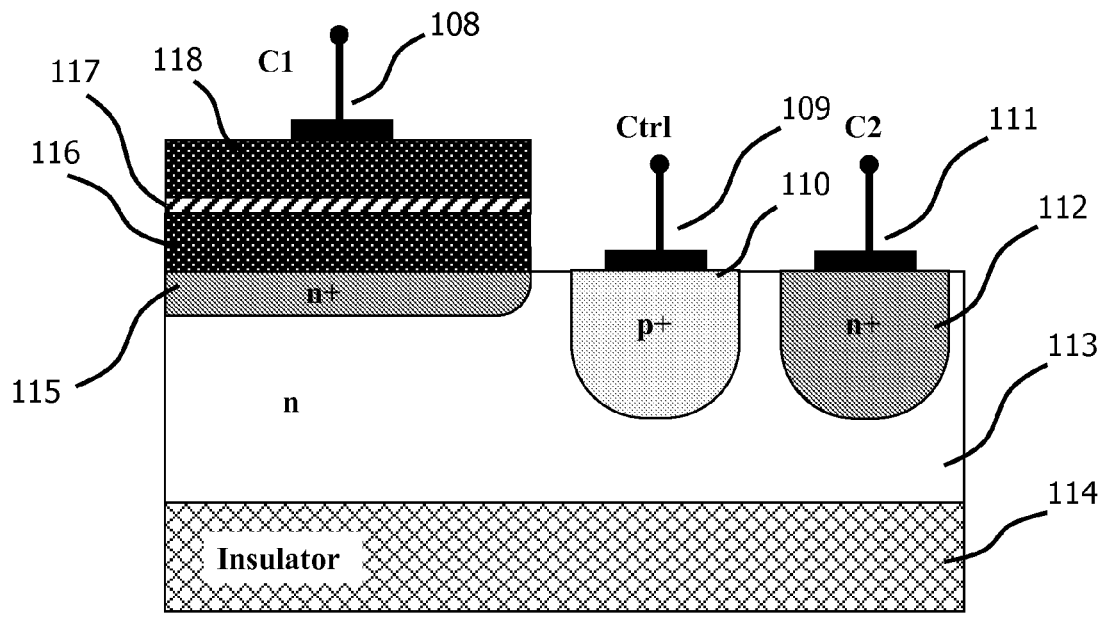
FIG. 13 shows a cross section view of a further embodiment of the present invention, where the MOS capacitor has been replaced with a MIM capacitor, in order to simplify the fabrication process.

If desired, in all the structures described above the MOS structure can be replaced with a Metal Insulator Metal (MIM) capacitor, so as to optimize the linearity of the system and simplify the fabrication process. An example of implementation of such configuration is illustrated in FIG. 13, where an extra metal layer 116 has been placed between the n+ region 115 and the dielectric layer 117, so as to replace the MOS capacitor with a MIM capacitor.

In many of the described embodiments, the p+ region can be replaced by a Schottky contact and/or the n+ region can be replaced with a metal ohmic contact. In the case where a Schottky contact is used in combination with a III-V semiconductor material process technology, an extra wide energy-gap layer can be interposed between the metal and the n-doped semiconductor in order to reduce the current leakage associated with the Schottky contact.

All the described embodiments can be built in many different technologies, comprising: Bulk, Silicon On Insulator, Silicon On Sapphire or III-V compound material technology with or without hetero-junctions. It is important to notice that a transcap device can also be utilized as a simple varactor by short-circuiting the CTRL terminal with the C1 (or C2) terminal.

All the embodiments illustrated above can be realized as both discrete or integrated components with minimal changes. For each one of them, the dual version can be obtained by simply substituting the n-doped implants with p-type ones and vice-versa. Many other configurations can be obtained combining the different embodiments and their variants.

N FIG. 14

Figure 14:
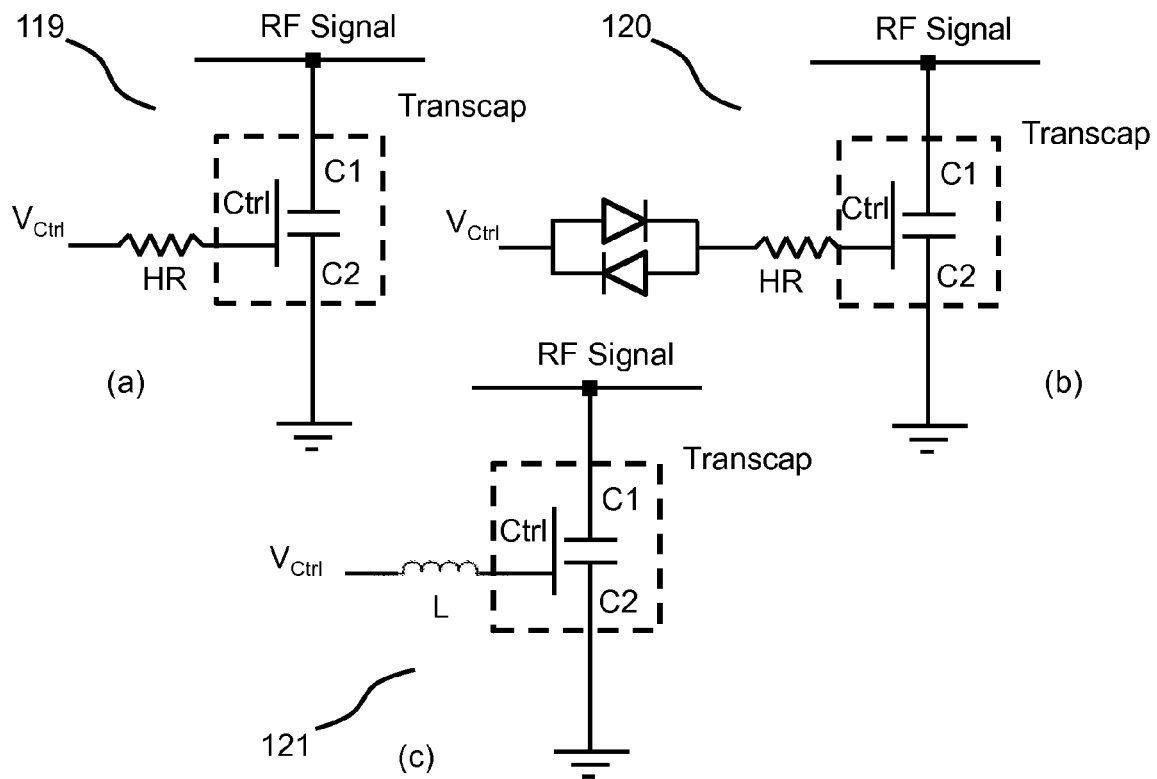
FIG. 14 shows three examples of control configuration suitable for a transcap device.

FIG. 14 illustrates the most conventional control configurations of a digital transcap device. As shown in FIG. 14(a), a high value resistance HR can be placed in series to the Ctrl terminal in order to bias the device control terminal without affecting the RF performance of the device.

FIG. 14(b) shows a possible variant of the previous configuration, where two anti-parallel diodes have been inserted in series to the high impedance HR in order to increase the AC de-coupling between the bias voltage and the control terminal of the transcap device. A similar approach can be utilized for all the control configurations herein disclosed. Furthermore, the HR resistor can also be replaced with an inductance as shown in FIG. 14(c). As well known to anyone skilled in the art, many other configurations can be used to bias the terminals of a variable capacitor.

O FIG. 15

Figure 15:
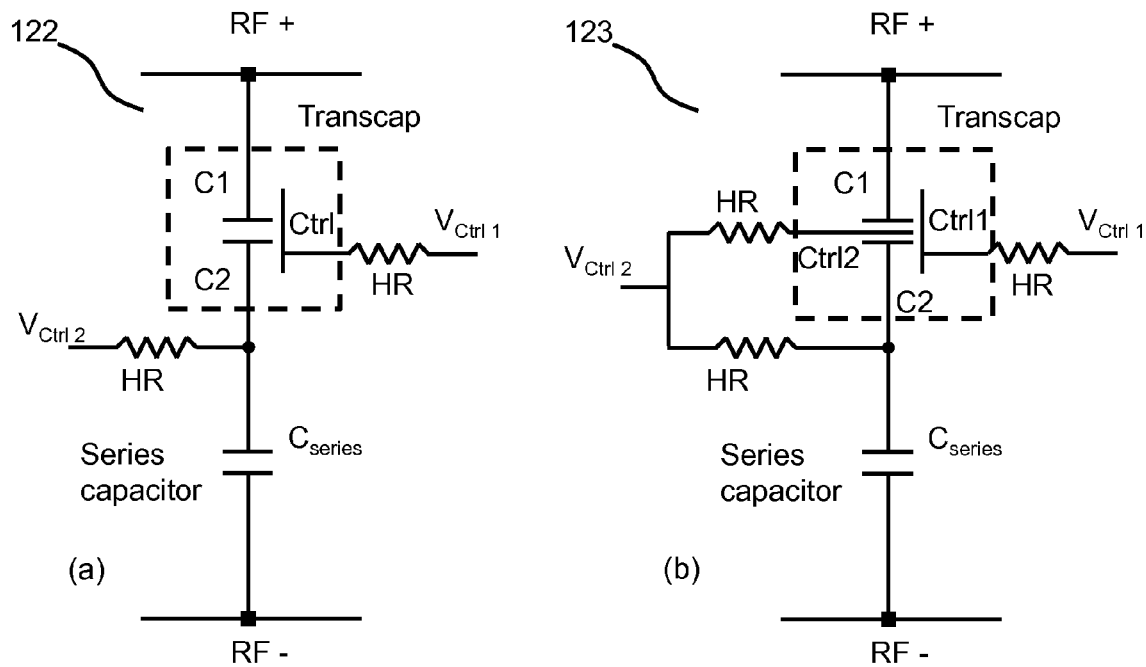
FIG. 15 shows a further example of control configuration for a transcap device with and without contact to the n+ region under the C1 oxide.

FIG. 15 shows an improved control configuration with respect to the ones of FIG. 14, where a series capacitor $C_{series}$ has been added between the transcap device and one of the RF terminals. In the illustrated cases, the control terminal of the transcap device can be coupled through a high impedance to ground (or to a bias DC source), and the middle node (obtained by coupling the C2 terminal to the series capacitance) can be used to modulate the total capacitance seen by the RF signal, by applying a positive DC bias. This configuration is suitable for both shunt or series tuning capacitor configurations.

P FIG. 16

Figure 16:
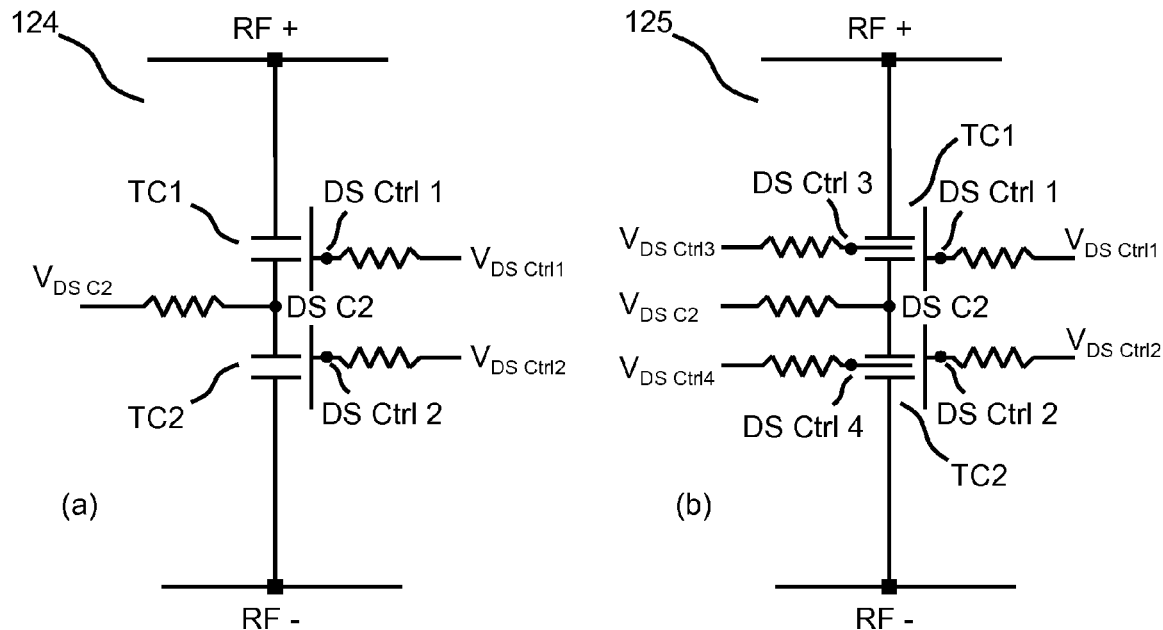
FIG. 16 shows a differential control configuration for a transcap device with and without contact to the n+ region under the C1 oxide.

An even better performing approach is shown FIG. 16(a), where two transcap devices TC1 and TC2 are connected back-to-back and the control terminals are biased through two high impedances. The middle node obtained by coupling the two C2 terminals effectively becomes a third control terminal, which can also be used to modulate the capacitance seen by the RF signal. As shown in FIG. 16(b) a similar configuration can also be obtained in the case where a fourth terminal has been added to the structure.

The differential series (DS) resulting from the connection back-to-back of two three-terminal transcap devices can be seen as a single device with 5 terminals (RF+, RF−, DS C2, DS Ctrl1, DS Ctrl2), where two of them (RF+ and RF−) are dedicated to the RF signal and three (DS C2, DS Ctrl1, DS Ctrl2) are used to modulate the capacitance value seen between RF+ and RF−. Similar considerations holds true for the connection back-to-back of two four-terminal transcap devices, with the difference that in this case the final device will have 7 terminals.

Q FIG. 17

Figure 17:
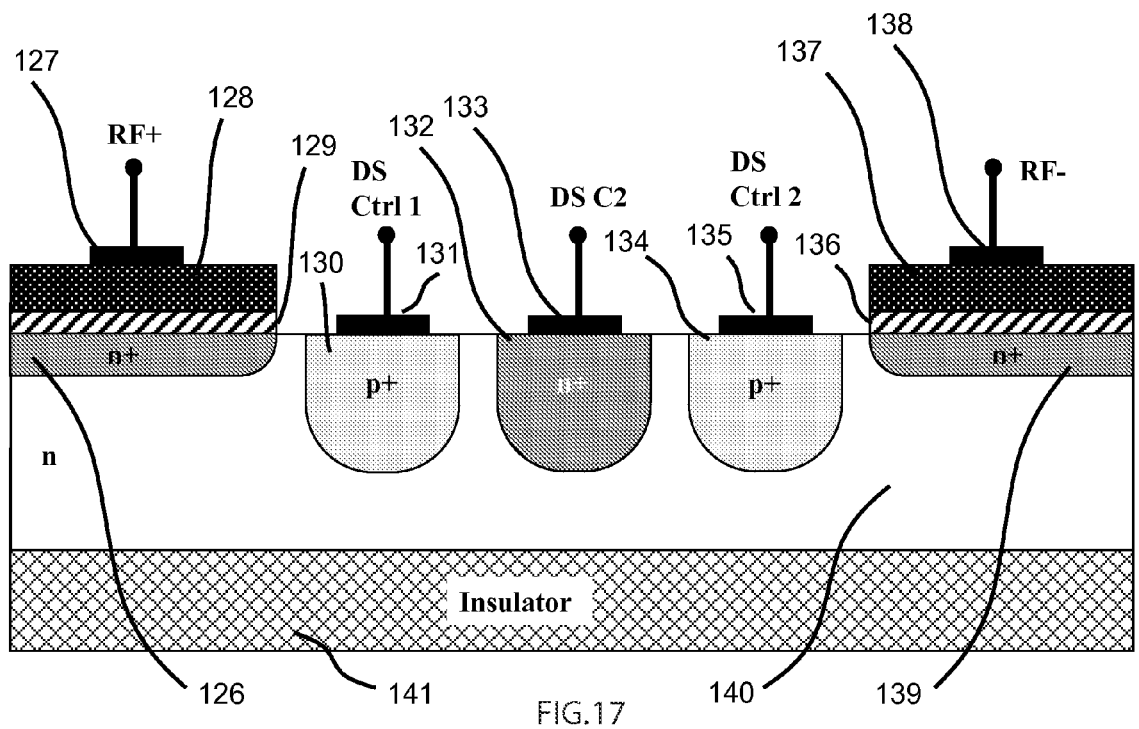
FIG. 17 shows an example of implementation of a 5 terminal differential-series transcap device realized using the device structure of FIG. 11.

FIG. 17 shows an example of implementation of the described differential-series approach, where two three-terminal transcap structures, resembling the one of FIG. 11, have been connected back-to-back in series to form an integrated 5 terminal device.

R FIG. 18

Figure 18:
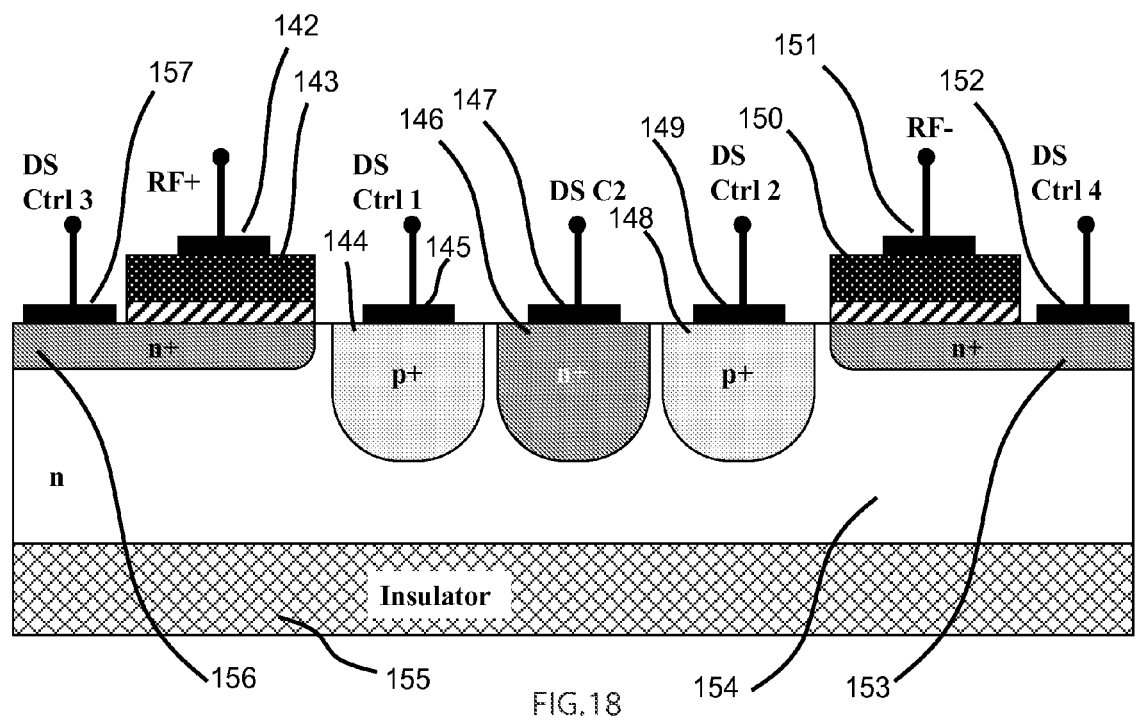
FIG. 18 shows a further example of implementation of a 7 terminal differential-series transcap device realized using the device structure of FIG. 12.

FIG. 18 illustrates another possible implementation of the differential-series approach by using the building block of FIG. 12. As well known to anyone skilled in the art, the same approach can be utilized with all the transcap structures herein described and their variants. In general, the ratio between the two transcap structures composing the differential-series configuration can be made different from the unity in order to cancel or minimize distortion effects, and improve the linearity of the system.

S FIG. 19

Figure 19:
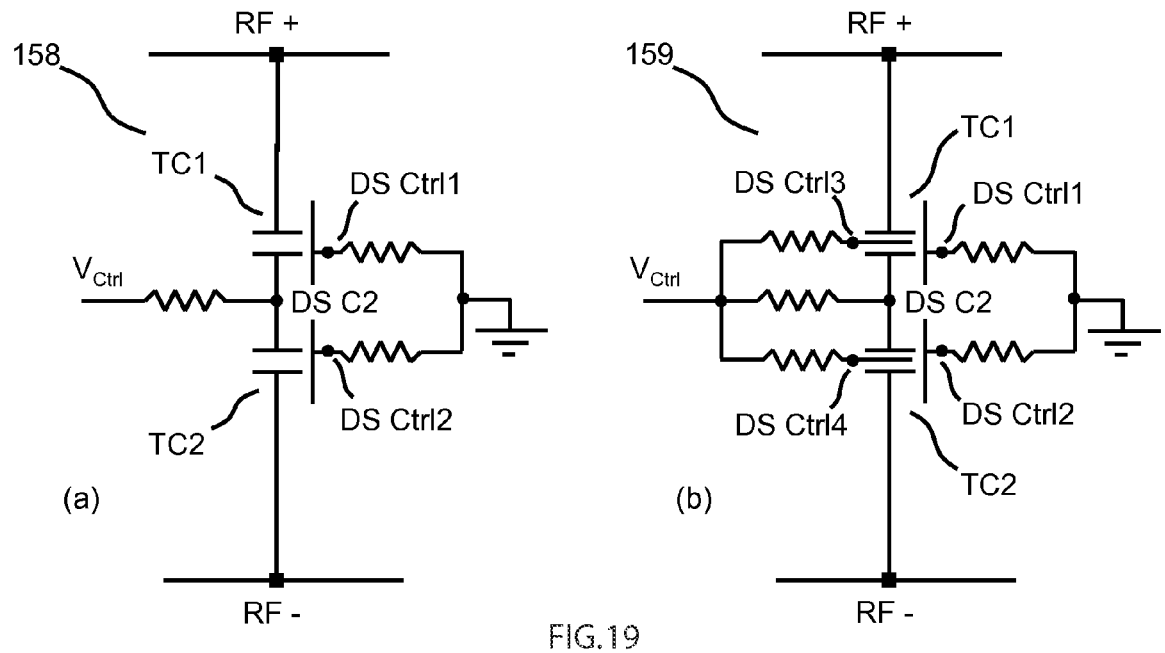
FIG. 19 shows an example of biasing configuration for a differential-series transcap device with and without contact to the n+ region under the C1 oxide.

FIG. 19 shows two possible configurations that can be used to bias the different terminals of a DS transcap device. As it can be seen, in both configurations, the DS Ctrl1 and DS Ctrl2 terminals have been coupled to ground through high impedances, and the central control terminal DS C2 is used to modulate the device capacitance between RF+ and RF− terminals. A MOS transistor can also be connected in parallel to each one of the high impedances used to bias the device terminals in order to speed up the tuning speed of the transcap device (i.e. the MOS devices are always off except during the transitions of the control voltage).

T FIG. 20

Figure 20:
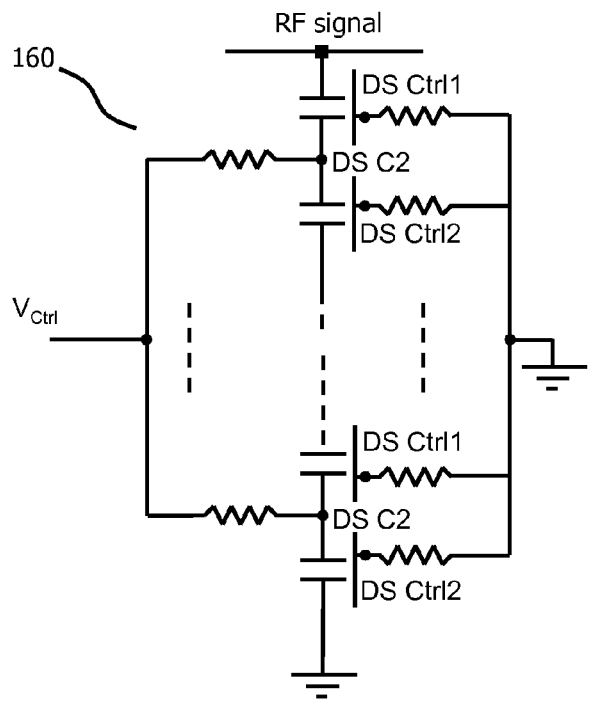
FIG. 20 shows an example of how to connect in series multiple differential-series transcap devices.

As shown in FIG. 20, by using the control configurations of FIG. 19, more structures can be placed in series by short-circuiting the resistors coupled to the DS C2 terminals, in order to withstand higher RF voltages.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A digital semiconductor variable capacitor comprising:
   a first equivalent capacitance plate;
   a second equivalent capacitance plate;
   at least one control region formed in a semiconductor region;
      wherein said control region forms a rectifying junction with at least a portion of said semiconductor region;
      wherein the capacitance value between said first and second capacitance plates of said semiconductor variable capacitor is varied by varying a control voltage;
      wherein the variation of said control voltage causes a variation of the voltage drop across said rectifying junction, and wherein the variation of said capacitance value as a function of said control voltage is substantially digital.

2. The semiconductor variable capacitor of claim 1, further comprising at least one barrier layer;
wherein said first capacitance plate comprises at least a portion of said semiconductor region;
wherein said second capacitance plate comprises a conductive region covering at least a portion of a surface of said barrier layer, and
wherein said barrier layer is made of one of the materials belonging to the group comprising dielectric and wide band-gap semiconductor materials.

3. The semiconductor variable capacitor of claim 1, further comprising:
at least one barrier layer;
wherein said first capacitance plate comprises a first and a second highly conductive regions formed in said semiconductor region;
wherein said second capacitance plate comprises a third highly conductive region covering at least a portion of a surface of said barrier layer;
wherein said barrier layer is made of one of the materials belonging to the group comprising dielectric and wide band-gap semiconductor materials, and
wherein each one of said first and second highly conductive regions is directly coupled to at least a portion of said semiconductor region.

4. The semiconductor variable capacitor of claim 1, further comprising:
at least one barrier layer;
wherein said first capacitance plate comprises:
a first and a second highly conductive regions formed in said semiconductor region;
a third highly conductive region directly coupled to at least one of said first and second highly conductive regions;
wherein said second capacitance plate comprises a fourth highly conductive region covering at least a portion of a surface of said barrier layer;
wherein said barrier layer is made of one of the materials belonging to the group comprising dielectric and wide band-gap semiconductor materials, and
wherein each one of said first and second highly conductive regions is directly coupled to at least a portion of said semiconductor region.

5. A semiconductor variable capacitor according to claim 1, further comprises:
at least a second, a third, a fourth and a fifth control region formed in said semiconductor region;
a first and a second conductive region forming, respectively, said first and second capacitance plates;
wherein said second control region forms a rectifying junction with said semiconductor region;
wherein each one of said third, fourth and fifth control regions is directly coupled to at least a portion of said semiconductor region.

6. A differential semiconductor variable capacitor comprising at least a first and a second semiconductor variable capacitor according to claim 1, wherein at least a portion of the first capacitance plate of said first semiconductor variable capacitor is directly coupled to at least a portion of the first capacitance plate of said second semiconductor variable capacitor.

7. A differential semiconductor variable capacitor comprising at least a first and a second semiconductor variable capacitor according to claim 1;
wherein the control regions of said first and second semiconductor variable capacitors form, respectively, a first and a second control region of said differential semiconductor variable capacitor, and
wherein the first capacitance plates of said first and said second semiconductor variable capacitors are directly coupled to a third control region of said differential semiconductor variable capacitor.

8. A differential semiconductor variable capacitor comprising at least a first and a second semiconductor variable capacitor according to claim 1,
wherein each one of said semiconductor variable capacitors comprises:
a first and a second highly conductive region, each one directly coupled to at least a portion of said semiconductor region;
wherein the control regions of said first and second semiconductor variable capacitors form, respectively, a first and a second control region of said differential semiconductor variable capacitor;
wherein said first highly conductive regions of said first and second semiconductor variable capacitors are placed in physical contact one to each other to form a third control region of said differential semiconductor variable capacitor, and
wherein the second highly conductive regions of said first and second semiconductor variable capacitors form, respectively, a fourth and a fifth control region of said differential semiconductor variable capacitor.

9. A method of operating a semiconductor variable capacitor comprising at least a first control region formed in a semiconductor region, a first equivalent capacitance plate and a second equivalent capacitance plate, the method comprising:
applying a control voltage between at least a portion of said semiconductor region and at least said first control region;
wherein the capacitance value between said first and second capacitance plates of said semiconductor variable capacitor is varied by varying said control voltage;
wherein said first control region forms a rectifying junction with at least a portion of said semiconductor region;
wherein the variation of said control voltage causes a variation of the voltage drop across said rectifying junction, and
wherein the variation of said capacitance value as a function of said control voltage is substantially digital.

10. The method of claim 9,
wherein the capacitance value between said first and said second capacitance plates is varied by means of depleting or enhancing at least a portion of said semiconductor region, and
wherein, when said control voltage overcomes a threshold voltage value, the depletion of a portion of said semiconductor material allows the splitting of said semiconductor variable capacitor into two series capacitors.

11. The method of claim 9,
wherein said semiconductor variable capacitor further comprises at least one barrier layer;
wherein said first capacitance plate comprises at least a portion of said semiconductor region;
wherein said second capacitance plate comprises a conductive region covering at least a portion of a surface of said barrier layer;

wherein said barrier layer is made of one of the materials belonging to the group comprising dielectric and wide band-gap semiconductor materials, and wherein the capacitance value between said first and second capacitance plates is varied by depleting or enhancing at least a portion of said semiconductor region.

12. The method of claim 9, wherein said semiconductor variable capacitor further comprises at least one barrier layer;

wherein said first capacitance plate comprises a first and a second highly conductive regions formed in said semiconductor region;

wherein said second capacitance plate comprises a third highly conductive region covering at least a portion of a surface of said barrier layer;

wherein said barrier layer is made of one of the materials belonging to the group comprising dielectric and wide band-gap semiconductor materials;

wherein each one of said first and second highly conductive regions is directly coupled to at least a portion of said semiconductor region, and wherein the capacitance value between said first and said second equivalent capacitance plates is varied by depleting or enhancing at least a portion of said semiconductor region.

13. The method of claim 9, wherein said semiconductor variable capacitor further comprises:
at least a second and a third control region formed in said semiconductor region;
a first and a second conductive regions forming, respectively, said first and second capacitance plates;
wherein said second control region forms a rectifying junction with said semiconductor region;
wherein said third control region is directly coupled to at least a portion of said semiconductor region, and
wherein said control voltage is applied between said third control region and said first and second control regions.

14. The method of claim 9, wherein said semiconductor variable capacitor further comprises:
at least a second, a third, a fourth, and a fifth control regions formed in said semiconductor region;
at least a first and a second conductive region forming, respectively, said first and second capacitance plates;
wherein said second control region forms a rectifying junction with said semiconductor region;
wherein each one of said third, fourth and fifth control regions is directly coupled to at least a portion of said semiconductor region, and
wherein said control voltage is applied between said third, fourth, and fifth control regions and said first and second control regions.

15. The method of claim 9, wherein said semiconductor variable capacitor further comprises:
at least a second and a third control regions formed in said semiconductor region;
at least a first and a second conductive region forming, respectively, said first and second capacitance plates;
wherein said second control region forms a rectifying junction with said semiconductor region;
wherein said third control region is directly coupled to at least a portion of said semiconductor region, and
wherein each one of said first, second and third control regions is coupled by means of a high impedance component to a bias voltage, and wherein an alternating signal is applied between said first and said second capacitance plates.

16. The method of claim 9, wherein said semiconductor variable capacitor further comprises:
at least a second, a third, a fourth, and a fifth control regions formed in said semiconductor region;
at least a first and a second conductive region forming, respectively, said first and second capacitance plates;
wherein said second control region forms a rectifying junction with said semiconductor region;
wherein each one of said third, fourth and fifth control regions is directly coupled to at least a portion of said semiconductor region, and
wherein each one of said first, second, third, fourth and fifth control regions is coupled through a high impedance component to a bias voltage, and wherein a radio-frequency signal is applied between said first and a second capacitance plates.

17. A method for generating a semiconductor variable capacitor comprising:
forming at least one control region in a semiconductor region;
forming a first equivalent capacitance plate;
forming a second equivalent capacitance plate;
wherein said control region forms a rectifying junction with at least a portion of said semiconductor region;
wherein the capacitance value between said first and second capacitance plates of said semiconductor variable capacitor is varied by varying a control voltage;
wherein the variation of said control voltage causes a variation of the voltage drop across said rectifying junction, and
wherein the variation of said capacitance value as a function of said control voltage is substantially digital.

18. The method of claim 17, further comprising:
forming a first and a second highly conductive region;
forming at least one barrier layer;
forming said second capacitance plate by means of deposition or epitaxial growth of a third highly conductive region covering at least a portion of a surface of said barrier layer;
wherein said barrier layer is made of one of the materials belonging to the group comprising dielectric and wide band-gap semiconductor materials, and
wherein each one of said first and second highly conductive regions is directly coupled to at least a portion of said semiconductor region.

19. The method of claim 17, further comprising
forming a first, a second, and a third highly conductive region;
forming at least a second control region is said semiconductor region;
wherein said second control region forms a rectifying junction with at least a portion of said semiconductor region, and
wherein each one of said first, second and third highly conductive regions is directly coupled to at least a portion of said semiconductor region.

20. The method of claim 17, further comprising:
forming a first, a second, and a third highly conductive region;
forming at least a second control region is said semiconductor region;
forming a first and a second barrier regions;

forming said first capacitance plate by means of deposition or epitaxial growth of a fourth highly conductive region covering at least a portion of a surface of said first barrier region;

forming said second capacitance plate by means of deposition or epitaxial growth of a fifth highly conductive region covering at least a portion of a surface of said second barrier region;

wherein said first and said second barrier regions are made of one of the materials belonging to the group comprising dielectric and wide band-gap semiconductor materials.

* * * * *